(12) United States Patent
Pilla

(10) Patent No.: US 9,632,148 B2
(45) Date of Patent: Apr. 25, 2017

(54) SENSOR DEVICE

(71) Applicant: Micronas GmbH, Freiburg (DE)

(72) Inventor: Camillo Pilla, Freiburg (DE)

(73) Assignee: Micronas GmbH, Freiburg (DE)

( * ) Notice: Subject to any disclaimer, the term of this patent is extended or adjusted under 35 U.S.C. 154(b) by 351 days.

(21) Appl. No.: 14/595,902

(22) Filed: Jan. 13, 2015

(65) Prior Publication Data

US 2015/0198678 A1    Jul. 16, 2015

(30) Foreign Application Priority Data

Jan. 13, 2014  (EP) .................................... 14000112

(51) Int. Cl.
  *G01R 33/07*  (2006.01)
  *G01R 33/09*  (2006.01)
  *G01R 33/00*  (2006.01)

(52) U.S. Cl.
  CPC ....... *G01R 33/077* (2013.01); *G01R 33/0047* (2013.01); *G01R 33/0094* (2013.01); *G01R 33/09* (2013.01)

(58) Field of Classification Search
  CPC ... G01R 33/077; G01R 33/09; G01R 33/0094
  See application file for complete search history.

(56) References Cited

U.S. PATENT DOCUMENTS

| | | | |
|---|---|---|---|
| 5,644,473 A | 7/1997 | Derouiche | |
| 5,783,463 A * | 7/1998 | Takehashi | H01L 21/565 257/E21.504 |
| 6,501,270 B1 | 12/2002 | Opie | |
| 7,250,760 B2 * | 7/2007 | Ao | G01D 5/145 324/252 |

(Continued)

FOREIGN PATENT DOCUMENTS

| | | |
|---|---|---|
| DE | 10 2010 030 801 A1 | 1/2012 |
| EP | 1 160 887 A2 | 12/2001 |

(Continued)

OTHER PUBLICATIONS

European Search Report (Extended) for European Application No. 14000112.4 dated Jul. 3, 2014.

(Continued)

*Primary Examiner* — Jermele M Hollington
(74) *Attorney, Agent, or Firm* — Muncy, Geissler, Olds & Lowe, P.C.

(57) ABSTRACT

A sensor device having a first housing with a first semiconductor body and a plurality of metallic terminal contacts for electrical contacting of a first sensor, and a second housing with a second semiconductor body with a plurality of metallic terminal contacts for electrical contacting of a second sensor. A section of the plurality of terminal contacts penetrates the second housing on the face side and the second semiconductor body is arranged with a back surface on a front side of the second metal substrate. The two housings form a module, whereby the two housings are connected form-fittingly to one another in the shape of a stack by a fixing device in a way in which the bottom side of the first housing is joined to the bottom side of the second housing and the plurality of terminal contacts of the two housings point in the same direction.

16 Claims, 5 Drawing Sheets

(56) References Cited

U.S. PATENT DOCUMENTS

| | | |
|---|---|---|
| 8,089,233 B2 | 1/2012 | Kanekawa et al. |
| 9,305,876 B2* | 4/2016 | Hosseini ............ H01L 23/49531 |
| 9,494,660 B2* | 11/2016 | David .................... G01R 33/00 |
| 9,529,013 B2* | 12/2016 | Racz .................... G01R 1/0416 |
| 2004/0080308 A1 | 4/2004 | Goto |
| 2007/0279053 A1 | 12/2007 | Taylor et al. |
| 2008/0237818 A1 | 10/2008 | Engel et al. |
| 2009/0294882 A1 | 12/2009 | Sterling |
| 2009/0315547 A1 | 12/2009 | Abwa et al. |
| 2011/0133732 A1 | 6/2011 | Sauber |
| 2012/0086090 A1 | 4/2012 | Sharma et al. |
| 2012/0146164 A1 | 6/2012 | Ausserlechner |
| 2014/0028290 A1* | 1/2014 | Petrie ................... G01R 15/207 324/144 |
| 2014/0218885 A1* | 8/2014 | Hosseini ........... H01L 23/49531 361/767 |
| 2015/0015249 A1* | 1/2015 | Ausserlechner ....... G01R 15/20 324/252 |

FOREIGN PATENT DOCUMENTS

| | | |
|---|---|---|
| EP | 1 271 159 A2 | 1/2003 |
| JP | H 03-32050 A | 2/1991 |
| JP | H 05-291482 A | 11/1993 |
| JP | H 06-85165 A | 3/1994 |
| JP | 2009-058291 A | 3/2009 |
| JP | 2009-520195 A | 5/2009 |
| JP | 2011-145165 A | 7/2011 |

OTHER PUBLICATIONS

Japanese Office Action for Japanese Application No. 2014-231442 dated Sep. 30, 2015 with English translation.

* cited by examiner

SENSOR DEVICE

This nonprovisional application claims priority under 35 U.S.C. §119(a) to European Patent Application No. 14000112.4, which was filed in Europe on Jan. 13, 2014, and which is herein incorporated by reference.

BACKGROUND OF THE INVENTION

Field of the Invention

The invention relates to a sensor device.

Description of the Background Art

DE 10 2010 030 801 A1 discloses integrated sensors, particularly Hall sensors, which are used, inter alia, for determining rotation angles for drive shafts. Furthermore, U.S. Pat. No. 5,644,473 and JP 3-32050 disclose stackable housings for IC.

SUMMARY OF THE INVENTION

It is therefore an object of the invention to provide a device that refines the conventional art. The object is attained by a sensor device according to the present invention.

According to an embodiment of the invention, a sensor device is provided, having a first housing with a bottom side and a top side and a face side and a back side and a first side surface and a second side surface, whereby the face side and the back side and the two side surfaces are arranged between the top side and the bottom side and whereby in the first housing a first semiconductor body with a top surface and a back surface is provided, and a first metal substrate is formed, with a front side and a back side, and whereby a plurality of preferably metallic terminal contacts are provided for electrical contacting of a first magnetic field sensor monolithically integrated with the first semiconductor body, and whereby in each case a section of the plurality of terminal contacts penetrates the first housing on the face side, and whereby the first semiconductor body is arranged with the back surface on the front side of the first metal substrate, and the first magnetic field sensor is formed on the top surface of the first semiconductor body, and wherein the first magnetic field sensor comprises a first main extension plane, whereby said first main extension plane is arranged parallel to the top surface of the first semiconductor body, and further a second housing with a bottom side and a top side and a face side and a back side and a first side surface and a second side surface is provided, whereby the face side and the back side and the two side surfaces are arranged between the top side and the bottom side, and whereby in the second housing a second semiconductor body with a top surface and a back surface is provided, and a second metal substrate is formed, and the second semiconductor body has a front side and a back side and a plurality of metallic terminal contacts, and the metallic terminal contacts are provided for electrical contacting of a second magnetic field sensor monolithically integrated with the second semiconductor body, whereby in each case a section of the plurality of terminal contacts penetrates the second housing on the face side, and whereby the second semiconductor body is arranged with the back surface on the front side of the second metal substrate, and the second magnetic field sensor is formed on the top surface of the second semiconductor body, and wherein the second magnetic field sensor comprises a second main extension plane, whereby said second main extension plane is arranged parallel to the top surface of the second semiconductor body and whereby the two housings form a module, and to form the module the two housings are connected form-fittingly to one another in the shape of a stack by a fixing device in a way in which the bottom side of the first housing is joined preferably form-fittingly to the bottom side of the second housing or in a way in which bottom side of the first housing is joined to the top side of the second housing, and the plurality of terminal contacts of the two housings point in the same direction or the plurality of terminal contacts of the two housings penetrate the housing on the same respective outer side, and wherein the surface normal of said first main extension plane is arranged in parallel to the surface normal of said second main extension plane and wherein in a perspective view alongside to the surface normal of the first main extension first said first main extension plane overlaps with said second main extension plane, so that the divergence in flux strength of an inhomogeneous magnetic field is reduced between first magnetic field sensor and second magnetic field sensor. It should be emphasized that metal substrate is generally called as leadframe and metallic terminal contacts as parts of the leadframe are also named as pins, whereas terminal contact on the surface of the semiconductor body are called generally as pads. In other words, the terminal contact of the leadframe that is the pin penetrates the housing of the sensors.

An advantage of the device of the invention is that the sensor device by means of joining of two individual similar or identical housings, whereby each of the two housings has a fully functional, electrically connected sensor, is provided more or less as an individual housing module. A further advantage is that the module has two substantially identical sensors within the process variation during production. As a result, the module-like sensor device has a high failure safety. In particular, in safety-related applications and in applications in which the sensor device is not readily accessible, by means of the increased failure safety the reliability of the product can be increased substantially and the downtime costs are reduced in that, for example, in case of a malfunction of one of the two sensors one can fall back on the measured values of the other sensor. A replacement of the entire sensor device can be avoided or be performed in association with a regular maintenance interval. A further advantage is that, because of the high degree of integration and the small outer dimensions of the module or the sensor device, nearly in all application cases identical ambient parameters act on both sensors; i.e., depending on the type of sensors, for example, the temperature or the strength of the magnetic field can be determined in duplicate with the sensor device at the location of the sensor device. Further, the average of the measured values of the two sensors can be determined and measurement inaccuracy can be reduced hereby.

In an embodiment the first main extension plane overlaps completely with the second main extension plane. In particular, the surface normal of said first main extension plane is arranged at the same point as the surface normal of the second main extension plane.

In another embodiment, the first housing and the second housing have substantially or exactly the same the same outer dimensions. In particular, the outer dimensions of the first housing preferably do not differ from the outer dimensions of the second housing or differ at most preferably exclusively by the formations for a joining. In another preferred embodiment, catches and/or projections are formed on the first housing and/or on the second housing in order to join the first housing with the second housing simply and cost-effectively. In another embodiment, fixing device is provided, whereby the fixing device is formed rod-shaped and each of the fixing device has a catch at a head end or at both head ends, so that one of the fixing device is formed clamp-like. It is preferred to form the fixing device separately, so that the first housing is connected force-fittingly to the second housing by means of the clamp-shaped fixing device. In another embodiment, it is preferable to provide projections on both housings, so that in the joined state the fixing device and/or at least the catches of the fixing device are integrated into the housing and form a positive fit. It is preferred furthermore to form a planar housing exterior side after attachment of the fixing device. In an embodiment, it is preferred to form the clamp-shaped fixing device separately, i.e., not integrally with the housing. It is preferred furthermore to provide two spaced-apart fixing device along the first side and along the second side.

In another embodiment, the one or more fixing devices are in one piece to the first housing and/or to the second housing. Tests have shown that it is advantageous on the bottom side of the first housing and on the bottom side of the second housing to form a rectangular recess and a rectangular formation or notch, whereby the two formations are spaced apart. Preferably during the joining of the first housing to the second housing the rectangular notch receives the rectangular recess form-fittingly, so that after joining of the two housings to the module on the outer side of the module no fixing device project and/or no gap forms between the two housings. It is advantageous furthermore to coat the bottom side of the first housing and/or the bottom side of the second housing with a glue-like fixing device, so that after the joining a force-fitting bond forms between the two housings.

In another embodiment, the two housings on the top side each have a stepped formation, whereby the thickness of the two housings in a first region of the step is smaller than the thickness in a second region of the step. It is preferred here that the second region abuts the face side of the particular housing.

In another embodiment, the two housings have a stepped formation along the first side surface and/or along the second side surface, whereby the width in the first region of the step is smaller than the width in the second region of the step.

In an embodiment, the stepped formations are formed on the first housing and on the second housing in each case at the same position on the top side as on the side surface, so that the outer dimensions of the two housings, i.e., the thickness as well as the width, are smaller in the first region than in the second region.

In another embodiment, the first housing and the second housing on the face side each have five terminal contacts, whereby in each case two terminal contacts are formed substantially shorter than the three other terminal contacts. It is preferred to form all terminal contacts in a single plane and to arrange each of the two shorter terminal contacts between two longer terminal contacts. Tests have shown that preferably signals for a so-called final test are present or are applied at the two middle terminal contacts. Such terminal contacts are generally obsolete after the final test.

In another embodiment, the first magnetic field sensor and/or the second magnetic field sensor are made as a Hall sensor, particularly as a Hall plate. It is preferred that the Hall plate is a vertical Hall plate. In a embodiment the main extension surface of the Hall plate is orthogonal to the top surface of the semiconductor Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
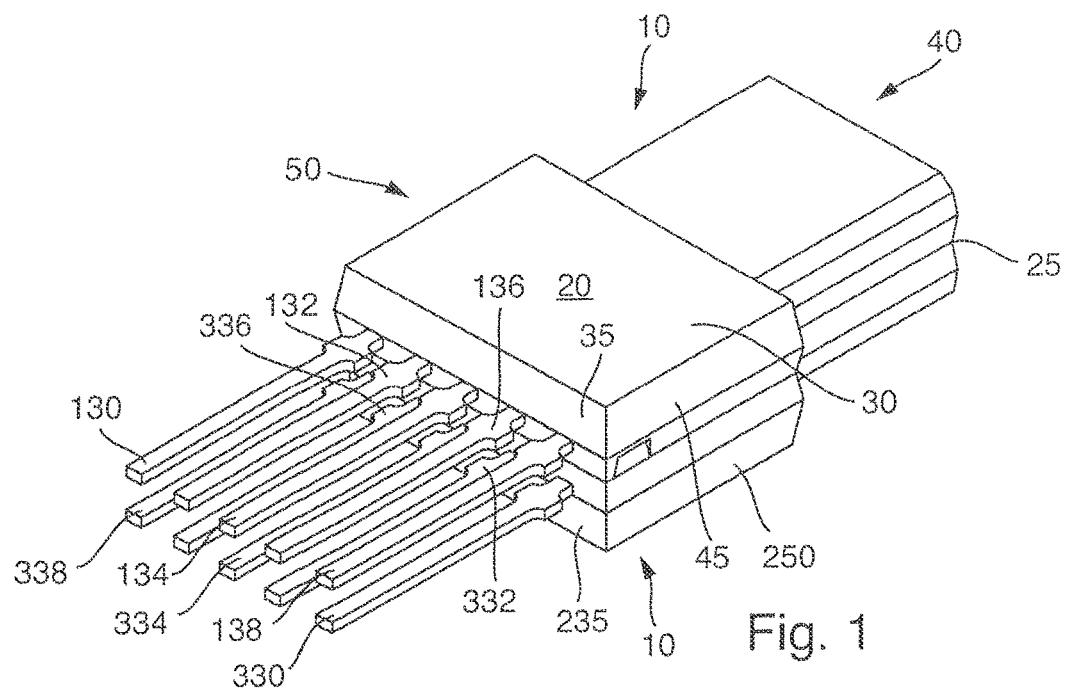
FIG. 1 shows a view of a first embodiment of the invention of a sensor device as a module.

The illustration in FIG. 1 shows a view of a first embodiment of the invention of a sensor device 10 formed as a module, having a first housing 20 and a second housing 220. It is understood that the outer dimensions of first housing 20 are preferably substantially identical, most preferably exactly identical to the outer dimensions of second housing 220. In the present case, two housings 20 and 220 are joined to form the module.

First housing 20 has a bottom side 25 and a top side 30. A face side 35 and a back side 40 and a first side surface 45 and a second side surface 50 are arranged between top side 30 and bottom side 25. Further, second housing 220 has a bottom side 225 and a top side 230. A face side 235 and a back side 240 and a first side surface 245 and a second side surface 250 are arranged between top side 230 and bottom side 225. In the present case, back side 40 of first housing 20 is connected force-fittingly to back side 240 of second housing 220 to form a module.

Stepped formations 400 are formed in each case on top side 30 of first housing 20 and on top side 230 of second housing 220 and on both side surfaces 45 and 50 of first housing 20 and on both side surfaces 245 and 250 of second housing 220. As a result, the module has larger outer dimensions on the face sides 35 of first housing 20 or on face side 235 of second housing 220 than on the two back sides 40 and 240.

A first sensor 120 (not shown) is integrated into first housing 20. First housing 20 is preferably made as IC housing. A total of five first terminal contacts 130, 132, 134, 136, and 138 penetrate first housing 20 on face side 35, whereby in each case a section of the five first terminal contacts 130, 132, 134, 136, and 138 is formed outside housing 20 and another section of the five first terminal contacts 130, 132, 134, 136, and 138 (not shown) is formed within first housing 20 and are partially molded in. The five first terminal contacts 130, 132, 134, 136, and 138 are preferably arranged precisely in one plane, whereby the distance between two directly adjacent terminal contacts 130, 132, 134, 136, and 138 is the same in each case.

A second sensor 320 (not shown) is integrated into second housing 220. First housing 220 is preferably made as IC housing. A total of five seconds terminal contacts 330, 332, 334, 336, and 338 penetrate second housing 220 on face side 235, whereby in each case a section of the five second terminal contacts 330, 332, 334, 336, and 338 is formed outside housing 220 and another section of the five second terminal contacts 330, 332, 334, 336, and 338 (not shown) is formed within second housing 220 and are partially molded in. The five second terminal contacts 330, 332, 334, 336, and 338 are preferably arranged precisely in one plane, whereby the distance between two directly adjacent second terminal contacts 330, 332, 334, 336, and 338 is the same in each case. It should be noted that terminal contacts 130, 132, 134, 136, and 138 or 330, 332, 334, 336, and 338 are also called pins.

First housing 20 and second housing 220 are connected force-fittingly to one another by a fixing device, whereby the bottom side of first housing 20 is joined form-fittingly to the bottom side of second housing 220 and is formed form-fittingly in the shape of a stack and the plurality of terminal contacts 130, 132, 134, 136, and 138 or 330, 332, 334, 336, and 338 of the two housings 20 and 220 point in the same direction. Preferred fixing devices can be, for example, adhesives.

Figure 2:
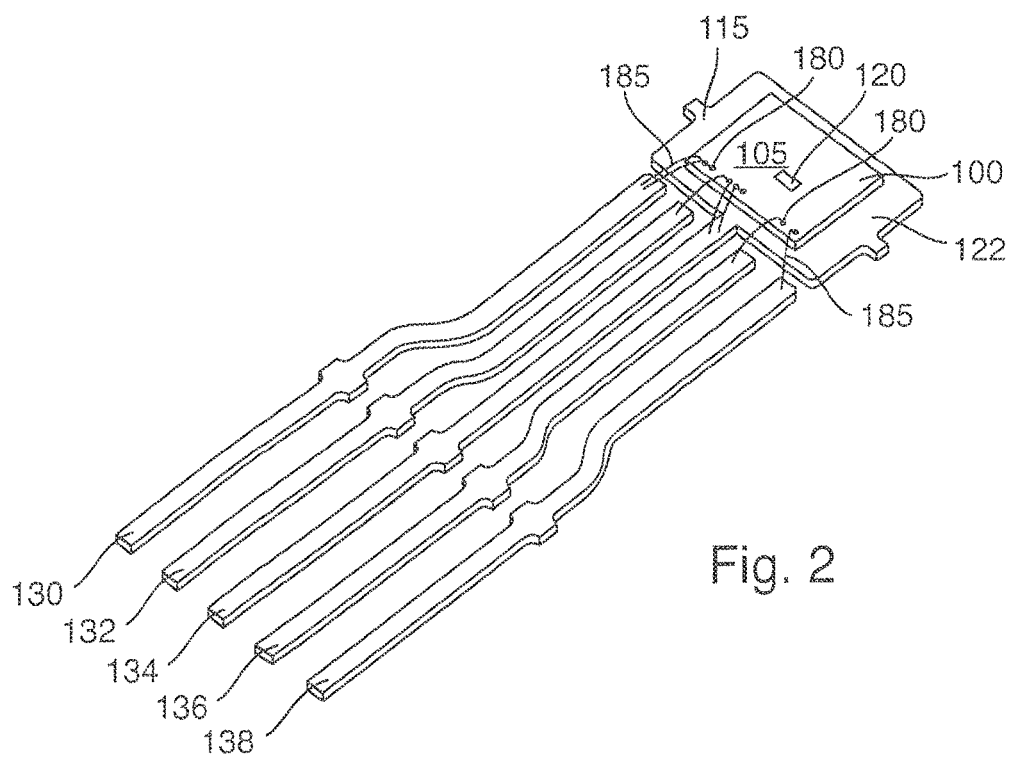
FIG. 2 shows a perspective view of a part, not within the housing, of the sensor device of FIG. 1.

A perspective view of a part of the structure, surrounded by first housing 20 of sensor device 10, is shown in the illustration of FIG. 2. Only the differences from the illustration in FIG. 1 will be explained below. A first semiconductor body 100, having a top surface 105 and a back surface 110, is arranged on a first metal substrate 115, whereby metal substrate 115 is also called a lead frame. Metal substrate 115 has a front side 117 and a back side 119. Semiconductor body 100 is connected force-fittingly to back area 110 on front side 117.

First sensor 120 is arranged as a monolithic part of semiconductor body 100 on top surface 105, whereby first sensor 120 is preferably made as a Hall sensor, most preferably as a Hall plate. A plurality of first bonding surfaces 180, so-called pads, are arranged on top surface 105 of first semiconductor body 100. The first bonding surfaces 180 are electrically connected by first bonding wires 185 to first terminal contacts 130, 132, 134, 136, and 138. As a result, first terminal contacts 130, 132, 134, 136, and 138 are electrically connected to first semiconductor body 100 and/or to first metal substrate 115. In the present case, all five first terminal contacts 130, 132, 134, 136, and 138 are equally long.

In an embodiment that is not shown, it is preferred to form a first integrated circuit on top surface 105 of semiconductor body 100. In this way, first sensor 120 can be supplied with an operating current and tap off a first sensor voltage and continue processing.

It should be noted that the internal structure of the part, surrounded by second housing 220, of sensor device 10 is identical to the structure surrounded by first housing 20. For example, second semiconductor body 300 is arranged on second metal substrate 315, whereby the second monolithically integrated sensor 320 is arranged on top surface 305 of second semiconductor body 300. Furthermore, second metal substrate 315 has a front side 317 and a back side 319 and second semiconductor body 300 a top surface 305 and a back surface 310.

Figure 3A:
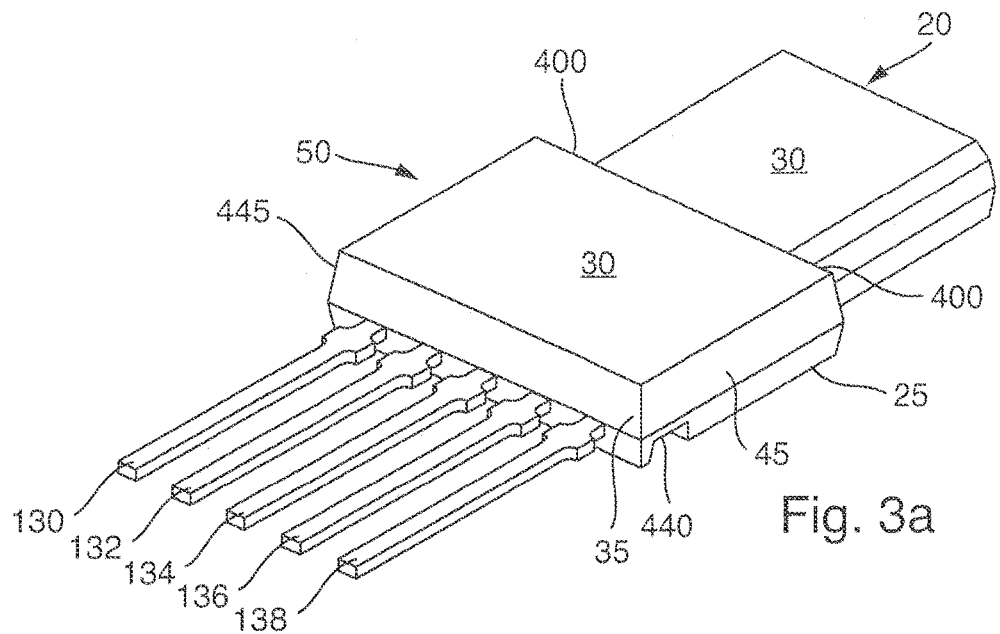
FIG. 3a shows a perspective view of a first embodiment of a first housing as a first part of the sensor device illustrated in FIG. 1.
Figure 3B:
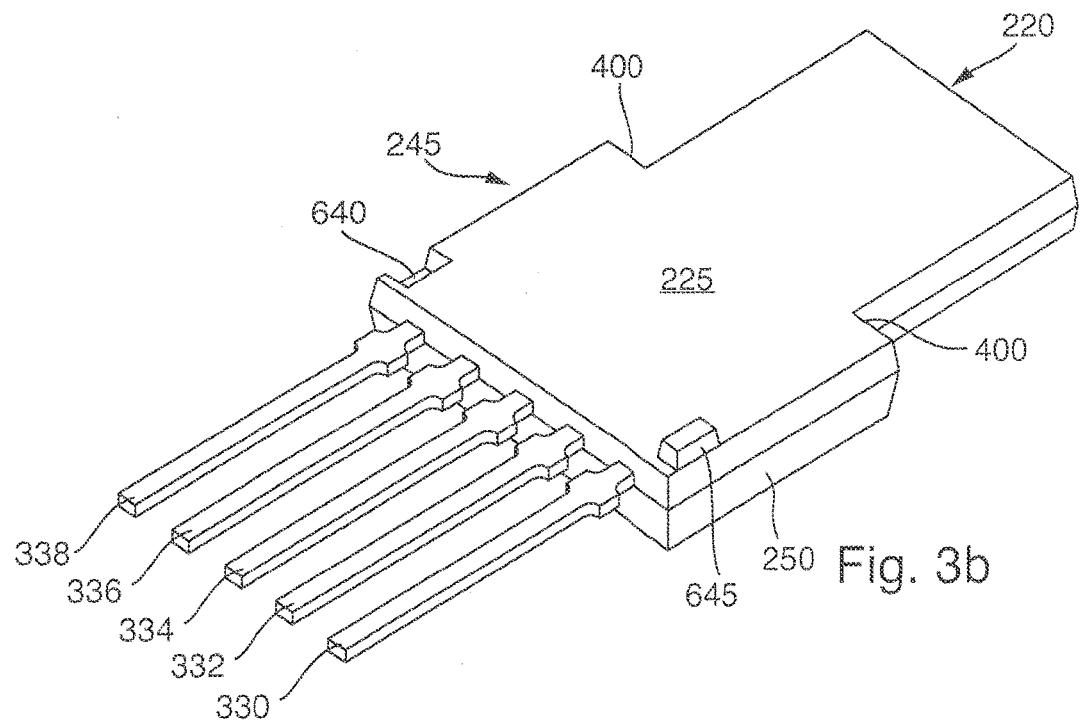
FIG. 3b shows a perspective view of a first embodiment of a second housing as a second part of the sensor device illustrated in FIG. 1.

A perspective view of first housing 20 is shown in the illustration of FIG. 3a and a perspective view of the second housing as a second part of sensor device 10 is shown in FIG. 1 in an unconnected state in FIG. 3b. Only the differences from the illustration in FIG. 1 will be explained below. On bottom side 25 of first housing 20, a rectangular depression 440 is formed as a first formation at the edge to first side surface 45 and a second rectangular recess 445 (not shown) is formed as a second formation on the opposite edge to second side surface 50.

Accordingly, on bottom side 225 of second housing 220 a first rectangular depression 640 is formed at the edge to first side surface 245 and a second rectangular projection 645 on the opposite edge to second side surface 250.

Rectangular depression 440 and rectangular projection 445 have dimensions substantially inverse to one another inverse, so that during joining of first housing 20 to second housing 220 a positive fit arises between the formations on the two housings 20 and 220.

Figure 4:
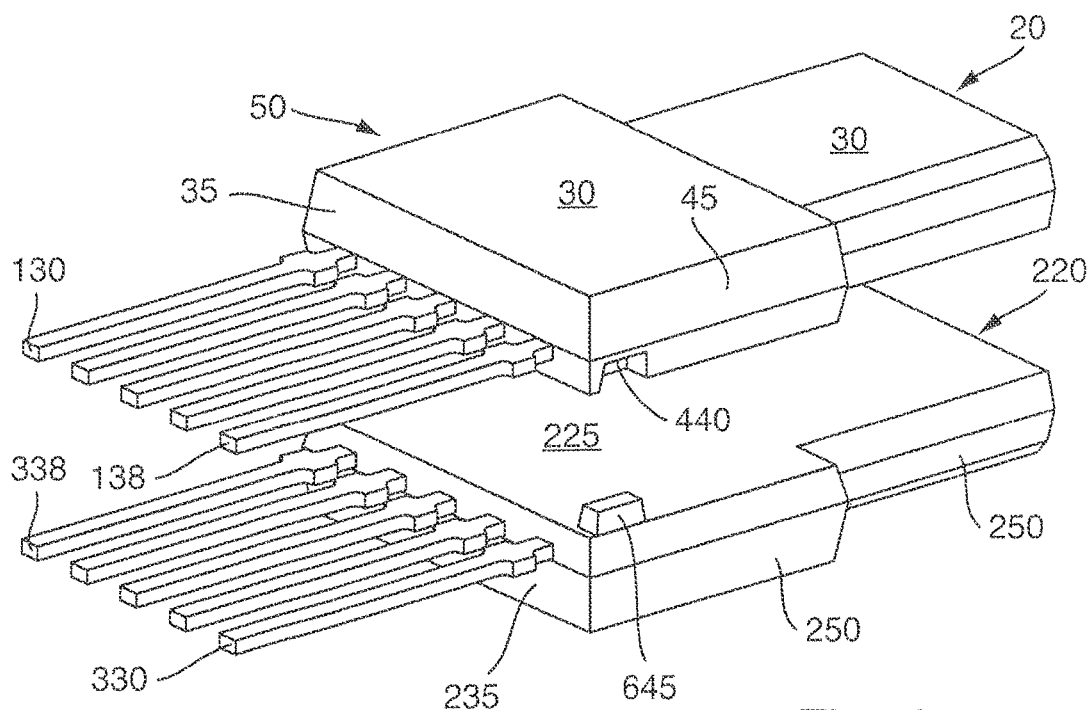
FIG. 4 shows a perspective view of the first housing and the second housing illustrated in FIG. 3a and in FIG. 3b immediately before joining.

In the illustration of FIG. 4, a perspective view of first housing 20 and second housing 220 is shown immediately before joining to sensor device 10, illustrated with the drawing documents of FIG. 1. Only the differences relative to the illustration of the previous figures will be explained below. Rectangular projections and depressions 440, 445, 640, and 645, arranged on the respective bottom sides 25 and 225 of first housing 20 and of second housing 220, during the joining process engage form-fittingly in one another and form a centering aid, so that the two housings 20 and 220 are positioned precisely one over the other.

Figure 5:
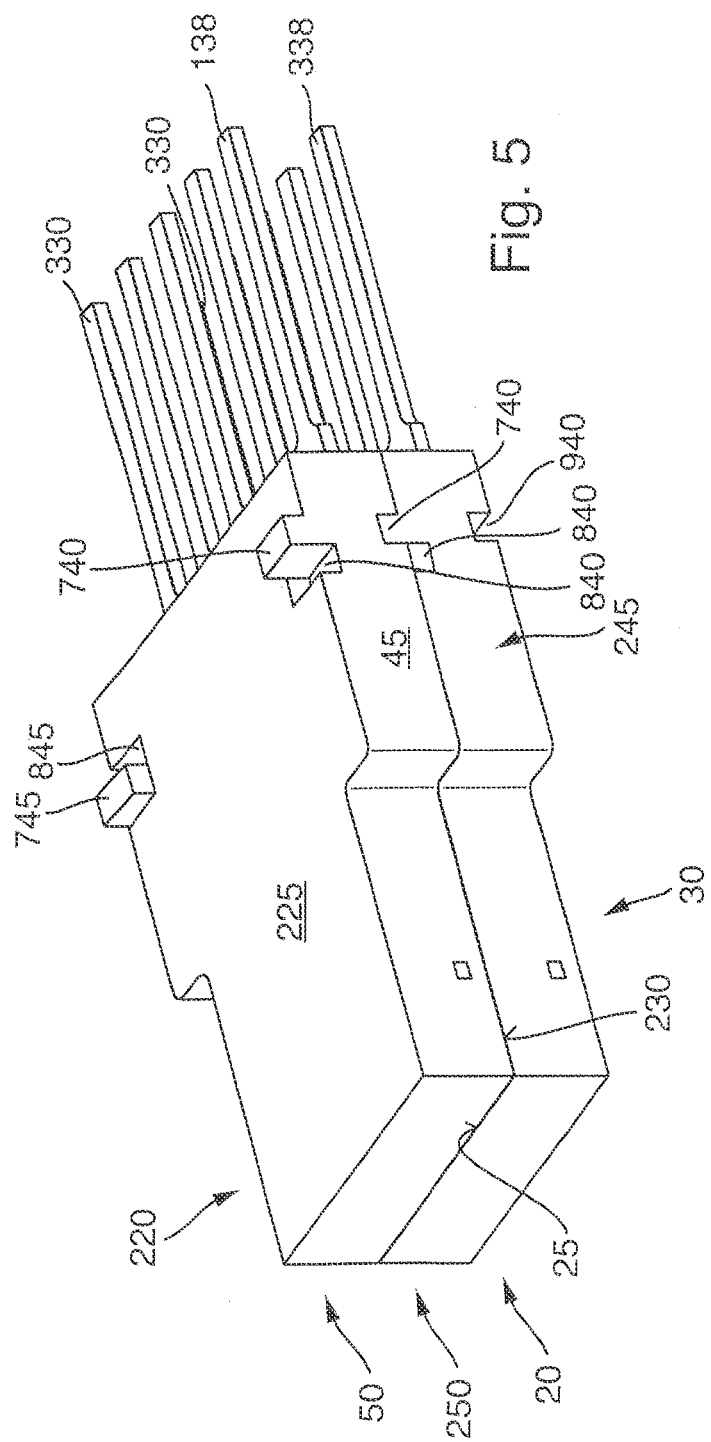
FIG. 5 shows a perspective view of a second embodiment of the first housing and second housing in which top side of the second housing is joined to the bottom side of the first housing.

In the illustration of FIG. 5, a perspective view of a second embodiment of the first housing and second housing are shown in which bottom side of the first housing is joined to the top side of the second housing. Only the differences relative to the illustration of the previous figures will be explained below. Rectangular elevations and depressions 740, 745, 840, and 845, arranged on the respective bottom sides 25 and 225 of first housing 20 and of second housing 220. On the respective top sides 30 and 230 rectangular depressions 940 and 945 are arranged. During the joining process the rectangular elevations 740 and 745 engage form-fittingly with the rectangular depressions 940 and 945 and form a centering aid, so that the two housings 20 and 220 are positioned precisely one over the other. Stepped formations 400 are formed in each case only on both side surfaces 45 and 50 of first housing 20 and on both side surfaces 245 and 250 of second housing 220. As a result, the module has larger outer dimensions on the face sides 35 of first housing 20 and on face side 235 of second housing 220 than on the two back sides 40 and 240. Because of, the first housing 20 and a second housing 220 are joined in a top side bottom side manner the five first terminal contacts 130, 132, 134, 136, and 138 of the first housing 20 and the five second terminal contacts 330, 332, 334, 336, and 338 of the second housing 220 are arranged accordingly. As an advantage both ICs are connectable crossing-free and both sensor signals are in-phase.

Figure 6:
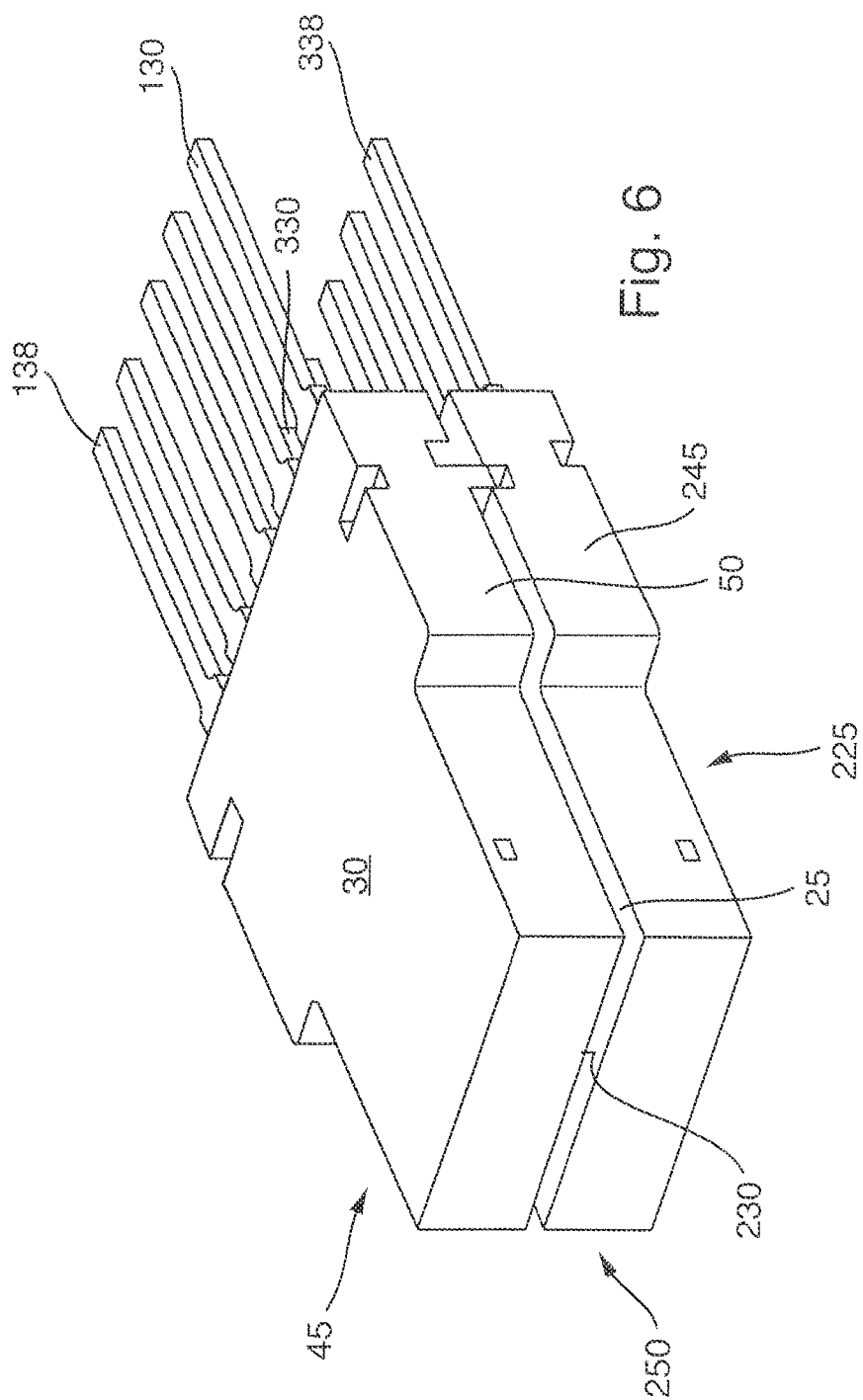
FIG. 6 shows a perspective view of a second embodiment of the first housing and second housing in which the bottom side of the first housing is joined to the bottom side of the second housing.

In the illustration of FIG. 6, a perspective view of an embodiment of the first housing and second housing are shown in which the bottom side of the first housing is joined to the bottom side of the second housing. Only the differences relative to the illustration of the previous figures will be explained below.

During the joining process the rectangular elevations 740 and 745 engage form-fittingly with the rectangular depressions 840 and 845 and form a centering aid, so that the two housings 20 and 220 are positioned precisely one over the other. Because of, the first housing 20 and a second housing 220 are joined in a bottom side bottom side manner the five first terminal contacts 130, 132, 134, 136, and 138 of the first housing 20 runs counter to the five second terminal contacts 330, 332, 334, 336, and 338 of the second housing 220. As a result, both ICs are stacked such that the sensor signal 120 and 220 of both sensors comes to signal with an opposite signs to each other.

It should be noted that in an embodiment that is not shown, the two housings also have an outer rectangular form and the respective terminal contacts are formed on the respective top side of the two housings. Other housing shapes can also be readily joined.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A sensor device comprising:
   a first housing with a bottom side, a top side, a face side, a back side, a first side surface, and a second side surface, the face side and the back side and the first and second side surfaces being arranged between the top side and the bottom side;
   a first semiconductor body with a top surface and a back surface formed in the first housing;
   a first metal substrate with a front side and a back side;
   a plurality of terminal contacts arranged on the top surface of the first semiconductor body for electrical contacting of a first magnetic field sensor monolithically integrated with the first semiconductor body, wherein a section of the plurality of terminal contacts penetrates the first housing on the face side, and wherein the first semiconductor body is arranged with the back surface on the front side of the first metal substrate, and wherein the first magnetic field sensor is formed on the top surface of the first semiconductor body, and wherein the first magnetic field sensor comprises a first main extension plane that is arranged parallel to the top surface of the first semiconductor body;
   a second housing with a bottom side, a top side, a face side, a back side, a first side surface, and a second side surface, the face side and the back side and the first and second side surfaces of the second housing being arranged between the top side and the bottom side of the second housing;
   a second semiconductor body with a top surface and a back surface is arranged in the second housing; and
   a second metal substrate with a front side, a back side, and a plurality of second terminal contacts for electrical contacting of a second magnetic field sensor monolithically integrated with the second semiconductor body, wherein a section of the plurality of second terminal contacts penetrates the second housing on the face side, and wherein the second semiconductor body is arranged with the back surface on the front side of the second metal substrate, and wherein the second magnetic field sensor is formed on the top surface of the second semiconductor body, and wherein the second magnetic field sensor comprises a second main extension plane arranged parallel to the top surface of the second semiconductor body,
   wherein the first and second housings form a module and are connected form-fittingly to one another in the shape of a stack by a fixing device such that the bottom side of the first housing is joined to the bottom side of the second housing or such that the top side of the first housing is joined to the bottom side of the second housing,
   wherein the plurality of terminal contacts of the first and second housings point in a same direction or the plurality of terminal contacts of the first and second housings penetrates the respective housing on the respective same outer side,
   wherein a surface normal of the first main extension plane is arranged in parallel to a surface normal of the second main extension plane, and
   wherein, in a perspective view alongside to the surface normal of the first main extension plane, the first main extension plane overlaps with the second main extension plane so that a divergence in flux strength of an inhomogeneous magnetic field is reduced between the first magnetic field sensor and the second magnetic field sensor.

2. The sensor device according to claim 1, wherein the first main extension plane overlaps completely with the second main extension plane.

3. The sensor device according to claim 1, wherein the surface normal of the first main extension plane is arranged at a same point as the surface normal of the second main extension plane.

4. The sensor device according to claim 1, wherein first housing and the second housing have substantially the same or exactly the same outer dimensions.

5. The sensor device according to claim 1, wherein catches and/or projections are formed on the first housing and/or on the second housing.

6. The sensor device according to claim 1, wherein the fixing device is formed rod-shaped and each fixing device has a catch at both head ends.

7. The sensor device according to claim 1, wherein two spaced-apart fixing device are provided along the first side surface and along the second side surface.

8. The sensor device according to claim 1, wherein the catches form a positive fit with the recesses.

9. The sensor device according to claim 1, wherein the fixing device is in one piece to the housing on the first housing and/or on the second housing and comprises rectangular elevations and/or rectangular depressions.

10. The sensor device according to claim 1, wherein the two housings on the top side each have a stepped formation and a thickness in a first region of the step is smaller than a thickness in a second region of the step.

11. The sensor device according to claim 10, wherein the second region abuts the face side of the two housings.

12. The sensor device according to claim 1, wherein the two housings have a stepped formation along the first side surfaces and/or along the second side surfaces and a width in the first region of the step is smaller than a width in the second region of the step and abuts the second region on the face side of the two housings.

13. The sensor device according to claim 1, wherein on the first housing and on the second housing the stepped formation is formed at a same position on the respective top side as on the respective side surface so that outer dimensions of the two housings are smaller in a first region than in a second region.

14. The sensor device according to claim 1, wherein the first magnetic field sensor and/or the second magnetic field sensor is a Hall sensors.

15. The sensor device according to claim 14, wherein the Hall sensor is formed as a vertical Hall plate.

16. The sensor device according to claim 14, wherein a main extension surface of the Hall plate is orthogonal to the top surface of the semiconductor body.

* * * * *